United States Patent
Li et al.

(10) Patent No.: US 10,883,188 B2
(45) Date of Patent: Jan. 5, 2021

(54) METHOD FOR MAKING MNBI$_2$TE$_4$ SINGLE CRYSTAL

(71) Applicants: Tsinghua University, Beijing (CN); HON HAI PRECISION INDUSTRY CO., LTD., New Taipei (TW)

(72) Inventors: Hao Li, Beijing (CN); Yang Wu, Beijing (CN); Yue-Gang Zhang, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 44 days.

(21) Appl. No.: 16/525,930

(22) Filed: Jul. 30, 2019

(65) Prior Publication Data
US 2020/0370199 A1 Nov. 26, 2020

(30) Foreign Application Priority Data
May 22, 2019 (CN) .......................... 2019 1 0430887

(51) Int. Cl.
  *C30B 1/10* (2006.01)
  *C30B 1/02* (2006.01)
  *C01G 29/00* (2006.01)

(52) U.S. Cl.
  CPC .............. *C30B 1/02* (2013.01); *C01G 29/006* (2013.01); *C01P 2002/72* (2013.01); *C01P 2002/82* (2013.01); *C01P 2002/85* (2013.01); *C01P 2004/03* (2013.01)

(58) Field of Classification Search
  CPC .. C30B 1/00; C30B 1/026; C30B 1/10; C30B 29/10
  See application file for complete search history.

(56) References Cited

PUBLICATIONS

M. M. Otrokov, et al. Prediction and observation of the first antiferromagnetic topological insulator. Nature (2019). as seen in the Technishe Universtat Dresden.*
Zeugner et al, "Chemical Aspects of the Antiferromagnetic Topological Insulator MnBi2Te4" article submittted by authors.*
Zeygner et al "Chemical Aspects of the Antiferromagnetic Topological Insulator MnBi2Te4" Chemistry of Materials, CHem Mater 2019 31 2795-2808.*

* cited by examiner

*Primary Examiner* — Robert M Kunemund
(74) *Attorney, Agent, or Firm* — ScienBiziP, P.C.

(57) ABSTRACT

A method for making MnBi$_2$Te$_4$ single crystal is provided. The method includes: providing a mixture of polycrystalline MnTe and polycrystalline Bi$_2$Te$_3$ in Molar ratio of 1.1:1~1:1.1; heating the mixture in a vacuum reaction chamber to 700° C.~900° C., cooling the mixture to 570° C.~600° C. slowly with a speed less than or equal to 1° C./hour, and annealing the mixture at 570° C.~600° C. for a time above 10 days to obtain an intermediate product; and air quenching the intermediate product from 570° C.~600° C. to room temperature. The method for making MnBi$_2$Te$_4$ single crystal is simple and has low cost.

16 Claims, 17 Drawing Sheets

METHOD FOR MAKING MNBI$_2$TE$_4$ SINGLE CRYSTAL

This application claims all benefits accruing under 35 U.S.C. § 119 from China Patent Application No. 201910430887.0, filed on May 22, 2019, in the China Intellectual Property Office, the disclosure of which is incorporated herein by reference.

BACKGROUND

1. Technical Field

The present disclosure relates to material technology, especially, to a method for making MnBi$_2$Te$_4$ single crystal.

2. Description of Related Art

It is firstly predicted that MnBi$_2$Te$_4$ is an antiferromagnetic topological insulator. Thus, how to make MnBi$_2$Te$_4$ single crystal attracts more attention.

In prior art, a MnBi$_2$Te$_4$ single crystal is grown by flux method. Mixtures of Mn (alfa aesar, 99.99%), Bi pieces (alfa aesar, 99.999%), and Te shots (alfa aesar, 99.999%) in the molar ratio of 1:10:16 (MnTe:Bi$_2$Te$_3$=1:5) were placed in a 2 ml alumina growth crucible of Canfield crucible set, and heated to 900° C. and held for 12 hours. After slowly cooling across a≈10 degree window below 600° C. in two weeks, the excess flux was removed by centrifugation above the melting temperature of 585° C. of Bi$_2$Te$_3$. However, it is relatively difficult to perform the centrifugation at the temperature of 585° C.

There is room for improvement in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
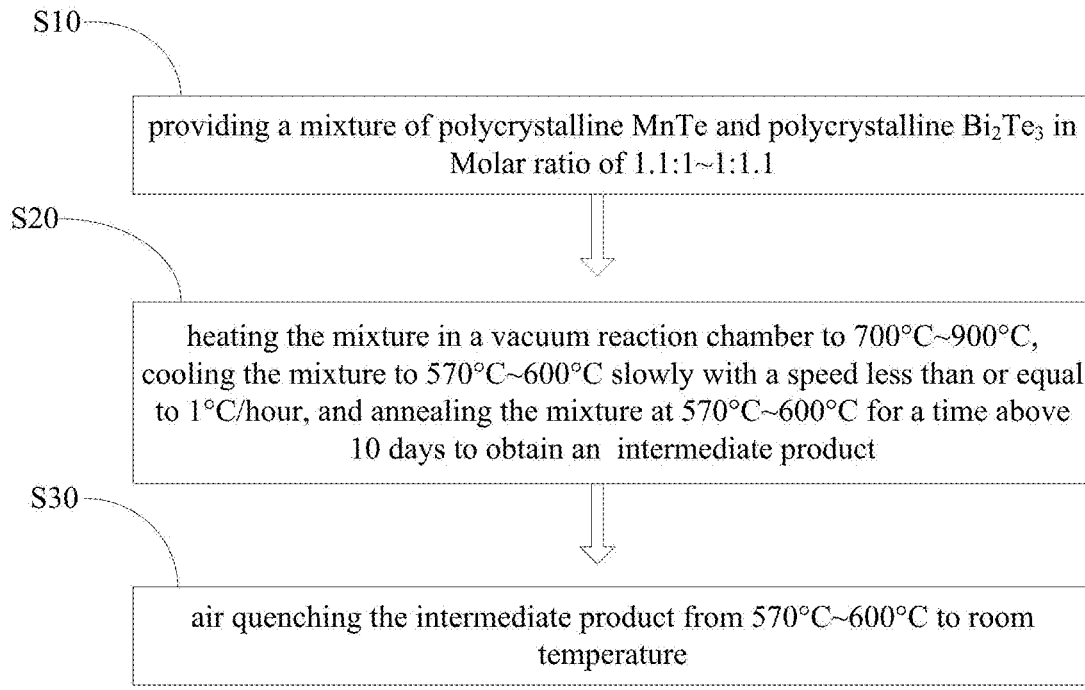
FIG. 1 shows a flow-chat of a method for making MnBi$_2$Te$_4$ single crystal.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale, and the proportions of certain parts may be exaggerated better illustrate details and features. The description is not to considered as limiting the scope of the embodiments described herein.

Several definitions that apply throughout this disclosure will now be presented. The term "coupled" is defined as connected, whether directly or indirectly through intervening components, and is not necessarily limited to physical connections. The connection can be such that the objects are permanently connected or releasably connected. The term "outside" refers to a region that is beyond the outermost confines of a physical object. The term "inside" indicates that at least a portion of a region is partially contained within a boundary formed by the object. The term "substantially" is defined to essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like. It should be noted that references to "an" or "one" embodiment in this disclosure are not necessarily to the same embodiment, and such references mean at least one.

References will now be made to the drawings to describe, in detail, various embodiments of the present methods for making $MnBi_2Te_4$ single crystal.

Referring to FIG. 1, the method for making $MnBi_2Te_4$ single crystal includes:

step S10, providing a mixture of polycrystalline MnTe and polycrystalline $Bi_2Te_3$ in Molar ratio of 1.1:1~1:1.1;

step S20, heating the mixture in a vacuum reaction chamber to 700° C.~900° C., cooling the mixture to 570° C.~600° C. slowly with a speed less than or equal to 1° C./hour, and annealing the mixture at 570° C.~600° C. for a time above 10 days to obtain an intermediate product; and step S30, air quenching the intermediate product from 570° C.~600° C. to room temperature.

In step S10, the polycrystalline MnTe and the polycrystalline $Bi_2Te_3$ can be made respectively at first and then mixed with each other. In one embodiment, the Molar ratio of the polycrystalline MnTe and the polycrystalline $Bi_2Te_3$ can be 1:1.

The polycrystalline MnTe can be made by following steps: mixing elemental Mn and Te (purity higher than 99.99%) in Molar ratio of 1:1 to obtain a Mn/Te mixture, sintering the Mn/Te mixture in a vacuum silica tube at 700° C.~1000° C. for about 3~5 days, and naturally cooling to obtain the polycrystalline MnTe.

The polycrystalline $Bi_2Te_3$ can be made by following steps: mixing elemental Bi and Te (purity higher than 99.99%) in Molar ratio of 2:3 to obtain a Bi/Te mixture, sintering the Bi/Te mixture in a vacuum silica tube at 700° C.~1000° C. for about 24~40 hours, slowly cooling the vacuum silica tube to 560° C.~580° C. by a speed of 0.1° C./minute and air quenching the intermediate product from 560° C.~580° C. to room temperature to obtain the polycrystalline $Bi_2Te_3$.

In step S10, the mixture of polycrystalline MnTe and polycrystalline $Bi_2Te_3$ can also be made directly from the elemental Mn, Bi and Te. In one embodiment, the mixture of polycrystalline MnTe and polycrystalline $Bi_2Te_3$ can be made by following steps: mixing elemental Mn, Bi and Te (purity higher than 99.99%) in Molar ratio of 1:2:4 to obtain a Mn/Bi/Te mixture, sintering the Mn/Bi/Te mixture in a vacuum silica tube at 700° C.~900° C. for about 3~5 days to obtain the mixture of polycrystalline MnTe and polycrystalline $Bi_2Te_3$. When the mixture of polycrystalline MnTe and polycrystalline $Bi_2Te_3$ is made by this method, the process of heating the mixture in the vacuum reaction chamber to 700° C.~900° C. of step S20 can be omitted.

In step S20, the pressure of the vacuum reaction chamber is less than 10 Pa. In one embodiment, the pressure of the vacuum reaction chamber is less than 1 Pa. In one embodiment, the pressure of the vacuum reaction chamber is less than 0.1 Pa. The reaction chamber can be a silica tube.

In step S30, the intermediate product is taken out of the reaction chamber directly and cooled in air.

Different exemplary embodiments and comparative embodiments are described as following.

Embodiment 1

Figure 2:
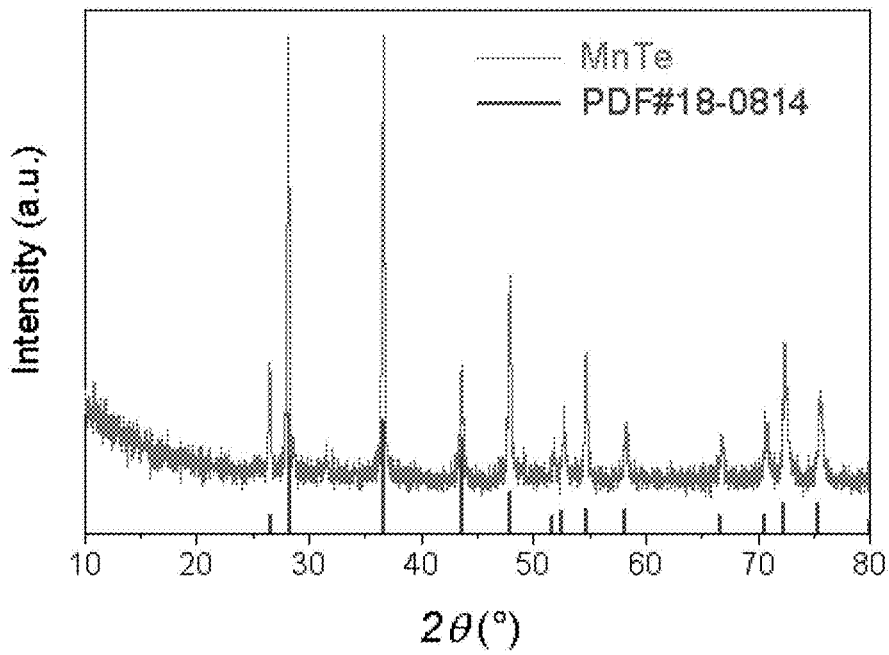
FIG. 2 shows an X-ray diffraction (XRD) pattern of the polycrystalline MnTe made in embodiment 1.
Figure 3:
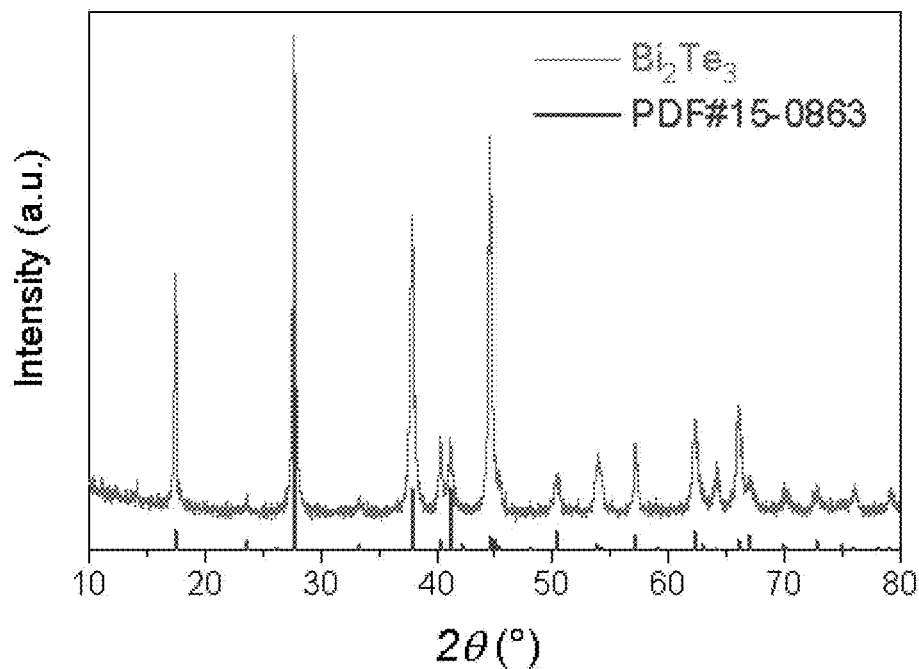
FIG. 3 shows an XRD pattern of the polycrystalline Bi$_2$Te$_3$ made in embodiment 1.

The polycrystalline MnTe is made by following steps: mixing elemental Mn and Te (purity higher than 99.99%) in Molar ratio of 1:1 to obtain a Mn/Te mixture, sintering the Mn/Te mixture in a vacuum silica tube at 1000° C. for about 3 days, and natural cooling the vacuum silica tube to obtain the polycrystalline MnTe. FIG. 2 shows the XRD pattern of the polycrystalline MnTe. The polycrystalline $Bi_2Te_3$ is made by following steps: mixing elemental Bi and Te (purity higher than 99.99%) in Molar ratio of 2:3 to obtain a Bi/Te mixture, sintering the Bi/Te mixture in a vacuum silica tube at 810° C. for about 24 hours, slowly cooling the vacuum silica tube to 560° C. by a speed of 0.1° C./minute and air quenching the intermediate product from 560° C. to room temperature to obtain the polycrystalline $Bi_2Te_3$. FIG. 3 shows the XRD pattern of the polycrystalline $Bi_2Te_3$. The polycrystalline MnTe and the polycrystalline $Bi_2Te_3$ are mixed in Molar ratio of 1:1 to form a mixture. The mixture is firstly heated to 700° C. in a vacuum silica tube, then cooled to 591° C. slowly with a speed of 0.6° C./hour, and then annealed at 591° C. for 10 days to obtain an intermediate product. The intermediate product is directly air quenched from 591° C. to room temperature to obtain reaction product. The polycrystalline MnTe powder and the polycrystalline $Bi_2Te_3$ powder are removed from the reaction product, and the $MnBi_2Te_4$ single crystal is obtained.

Embodiment 2

The polycrystalline MnTe and the polycrystalline $Bi_2Te_3$ are mixed in Molar ratio of 1:1 to form a mixture. The mixture is first heated to 700° C. in a vacuum silica tube, then cooled to 591° C. slowly with a speed of 0.6° C./hour, and then annealed at 591° C. for 14 days to obtain an intermediate product. The intermediate product is directly air hardened from 591° C. to room temperature to obtain reaction product. The polycrystalline MnTe powder and the polycrystalline $Bi_2Te_3$ powder are removed from the reaction product, and the $MnBi_2Te_4$ single crystal is obtained. The method of embodiment 2 is similar with the method of embodiment 1, except that the annealing time is 14 days.

Figure 4:
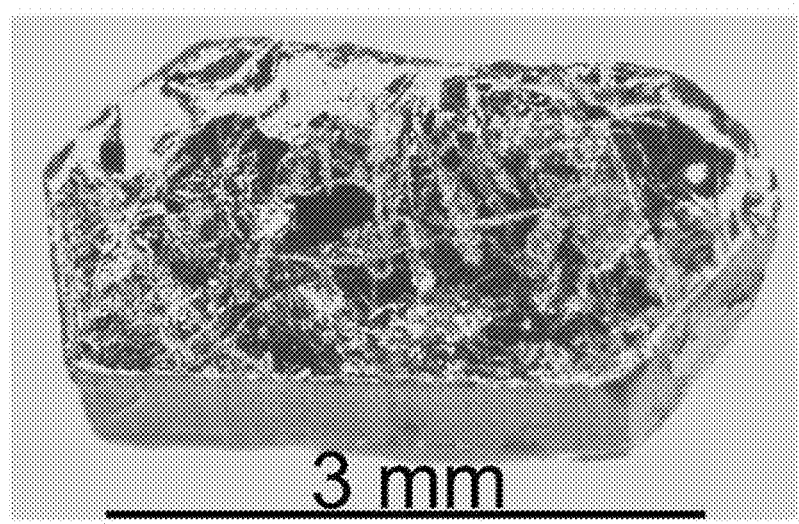
FIG. 4 shows an optical microscope image of the MnBi$_2$Te$_4$ single crystal made in embodiment 2.

FIG. 4 shows an optical micrograph of the $MnBi_2Te_4$ single crystal made in embodiment 2. It can be seen that the $MnBi_2Te_4$ single crystal has a length of about 3 millimeters and a flat surface with a hexagonal shape.

Figure 5:
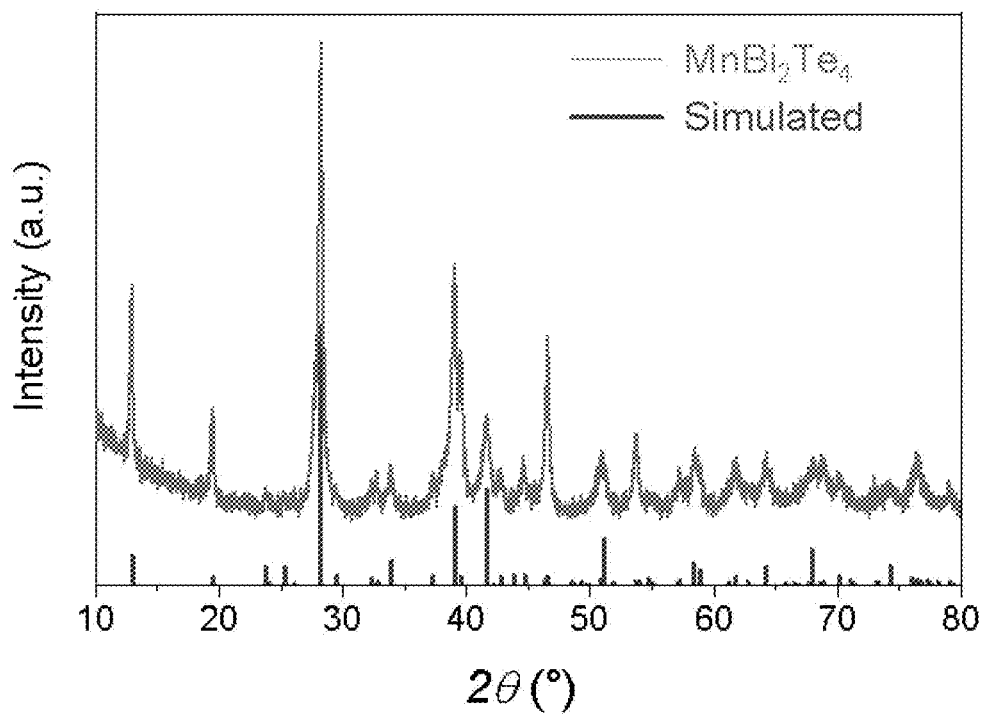
FIG. 5 shows an XRD pattern of the MnBi$_2$Te$_4$ single crystal made in embodiment 2.

FIG. 5 shows an XRD pattern of the $MnBi_2Te_4$ single crystal made in embodiment 2 after being ground to powder. It can be seen that the XRD pattern of the $MnBi_2Te_4$ single crystal fits well with the calculated XRD pattern of the standard $MnBi_2Te_4$. Thus, the $MnBi_2Te_4$ single crystal made in embodiment 2 is a hexagonal $MnBi_2Te_4$ crystal with $R\bar{3}$ space group. The XRD pattern almost has no impurity peak, and it indicates that the $MnBi_2Te_4$ single crystal made in embodiment 2 has high purity. The XRD peaks have narrow width and high intensity, and it indicates that the $MnBi_2Te_4$ single crystal made in embodiment 2 has high quality.

Figure 7:
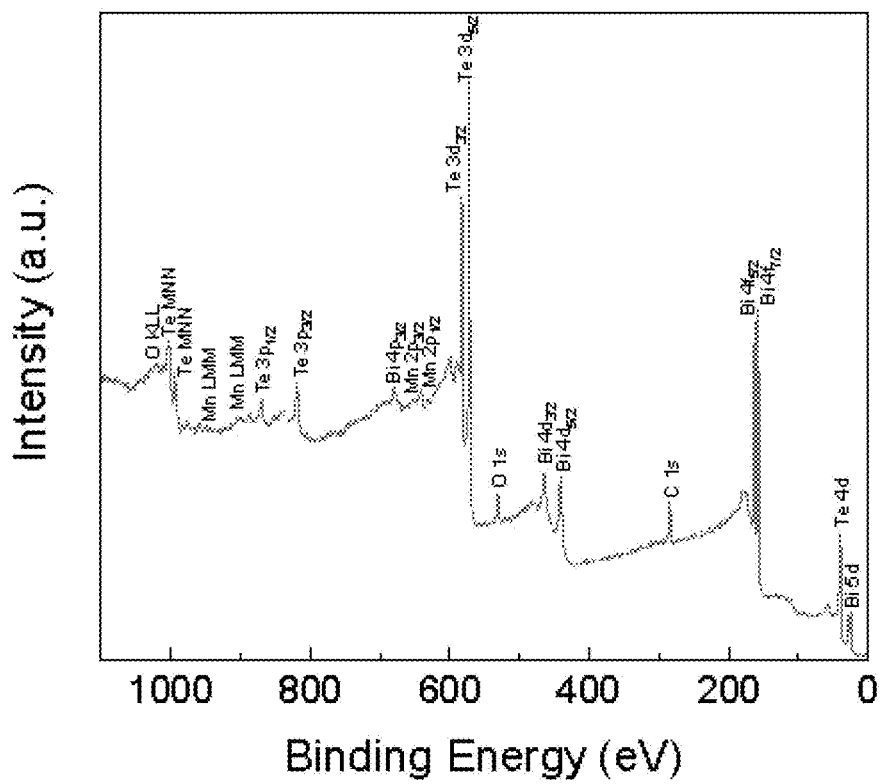
FIG. 7 shows a survey X-ray photoelectron spectrum (XPS) result of a fresh surface of the MnBi$_2$Te$_4$ single crystal made in embodiment 2.
Figure 8:
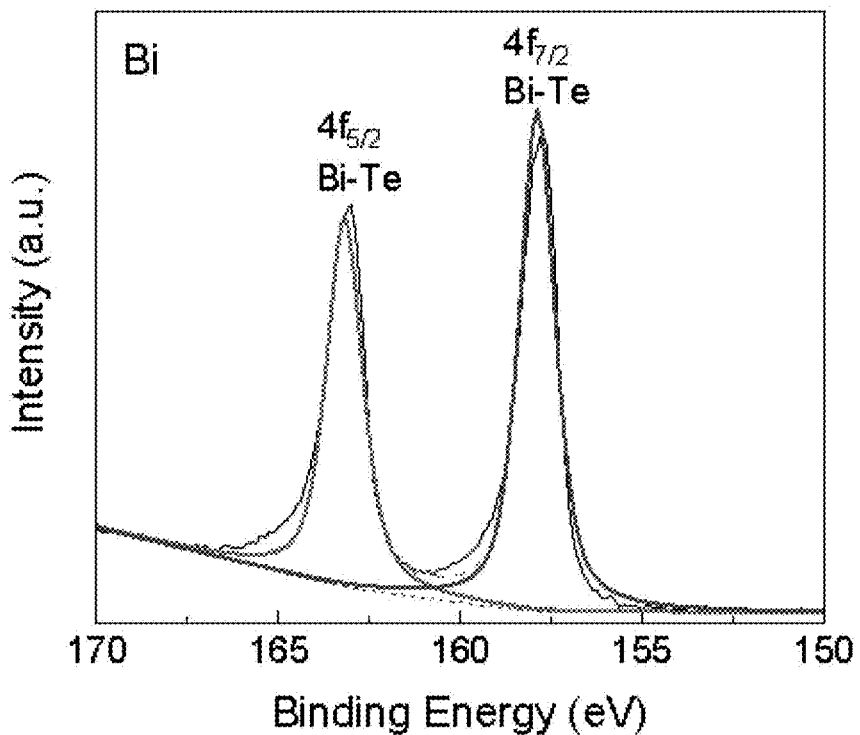
FIG. 8 shows a high resolution XPS spectrum of Bi 4$f$ of the fresh surface of the MnBi$_2$Te$_4$ single crystal made in embodiment 2.
Figure 9:
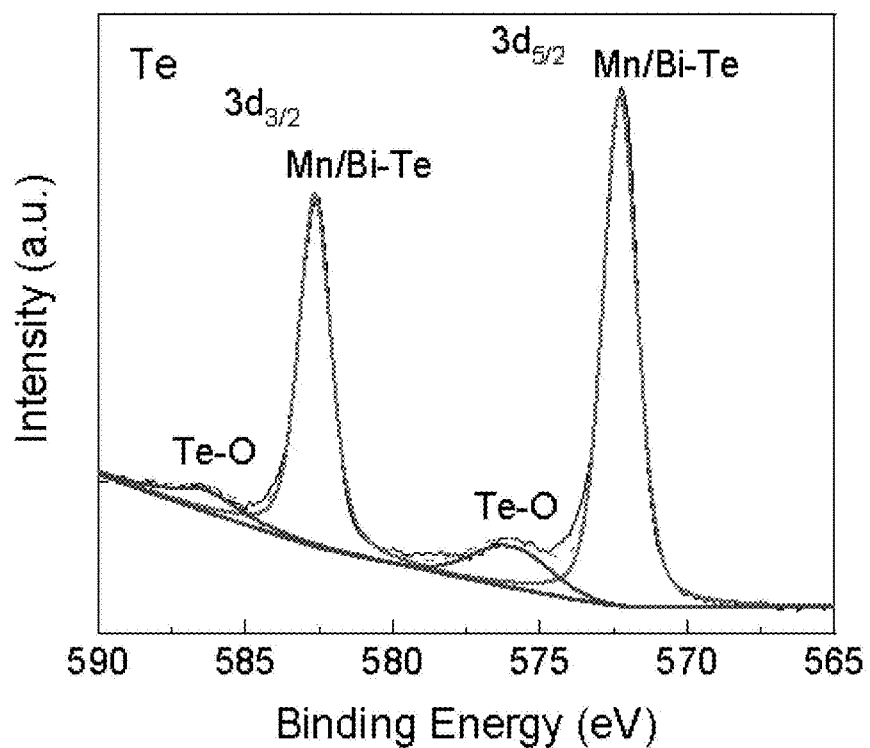
FIG. 9 shows a high resolution XPS spectrum of Te 3$d$ of the fresh surface of the MnBi$_2$Te$_4$ single crystal made in embodiment 2.
Figure 10:
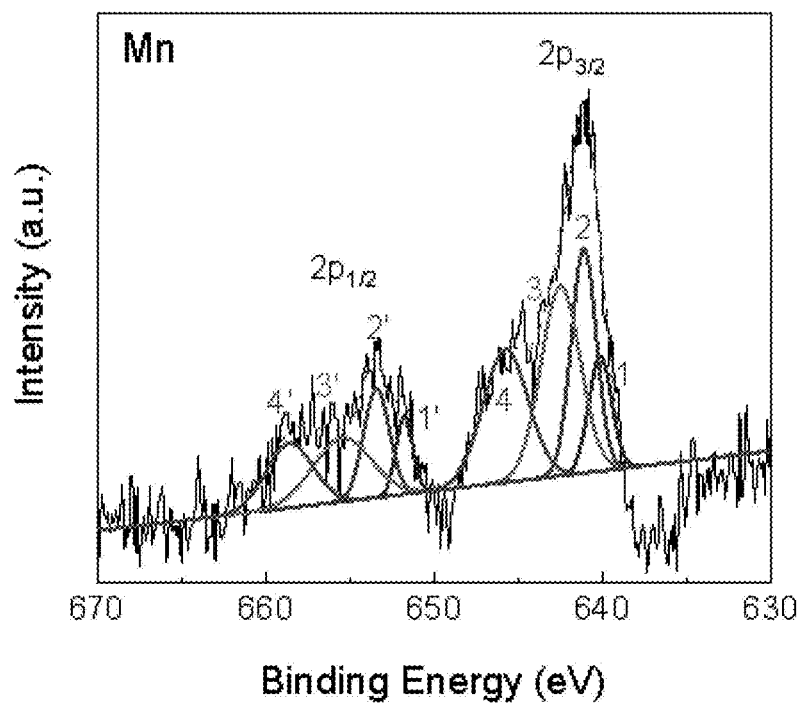
FIG. 10 shows a high resolution XPS spectrum of Mn 2$p$ of the fresh surface of the MnBi$_2$Te$_4$ single crystal made in embodiment 2.

FIG. 7 shows a survey XPS spectrum of a fresh surface of the $MnBi_2Te_4$ single crystal made in embodiment 2. FIG. 8 shows a high resolution XPS spectrum of Bi 4$f$ of the fresh surface of the $MnBi_2Te_4$ single crystal made in embodiment 2. FIG. 9 shows a high resolution XPS spectrum of Te 3$d$ of the fresh surface of the $MnBi_2Te_4$ single crystal made in embodiment 2. FIG. 10 shows a high resolution XPS spectrum of Mn 2$p$ of the fresh surface of the $MnBi_2Te_4$ single crystal made in embodiment 2.

Figure 11:
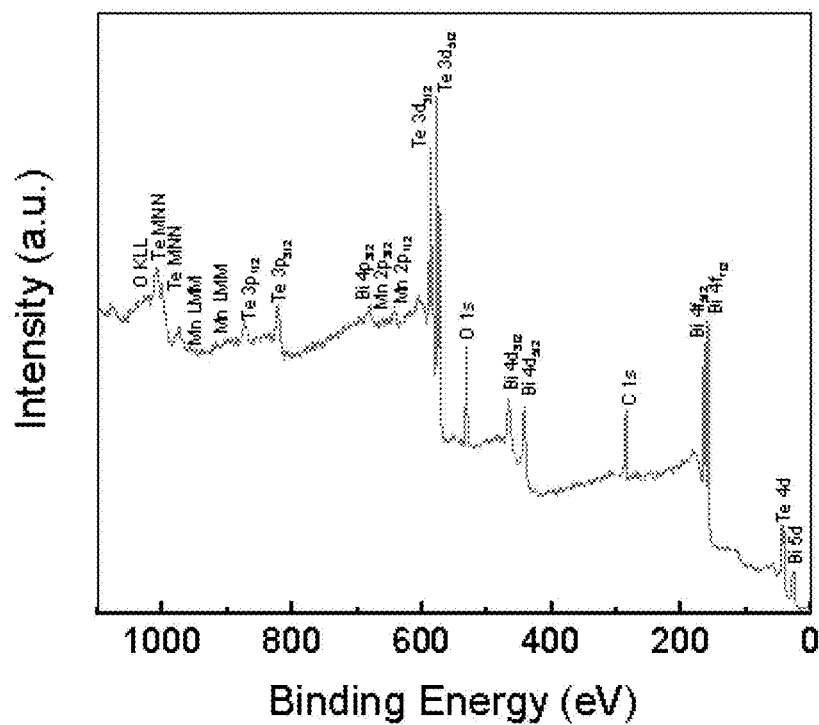
FIG. 11 shows an XPS of an oxidized surface of the MnBi$_2$Te$_4$ single crystal made in embodiment 2.
Figure 12:
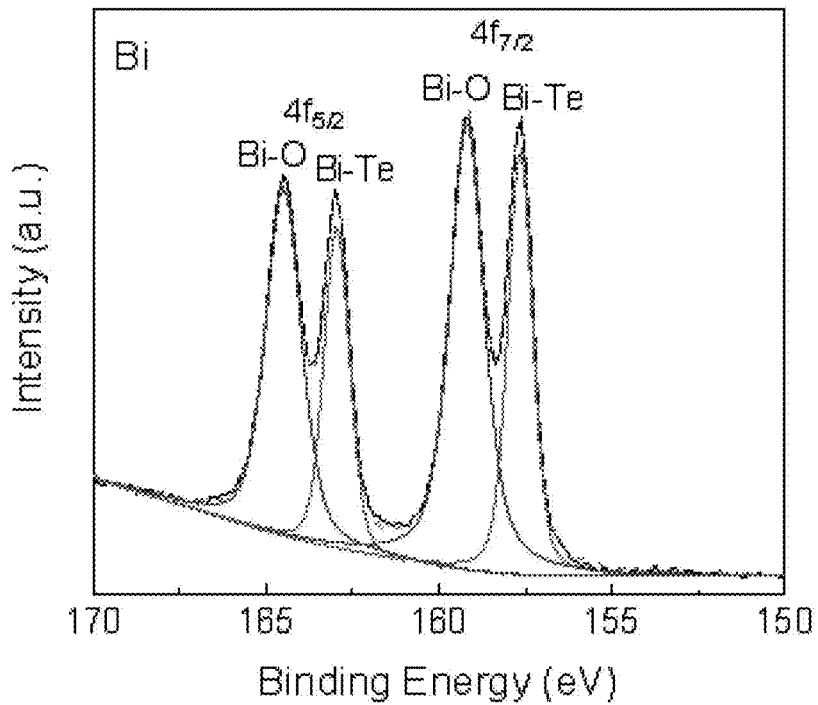
FIG. 12 shows a high resolution XPS spectrum of Bi 4$f$ of the oxidized surface of the MnBi$_2$Te$_4$ single crystal made in embodiment 2.
Figure 13:
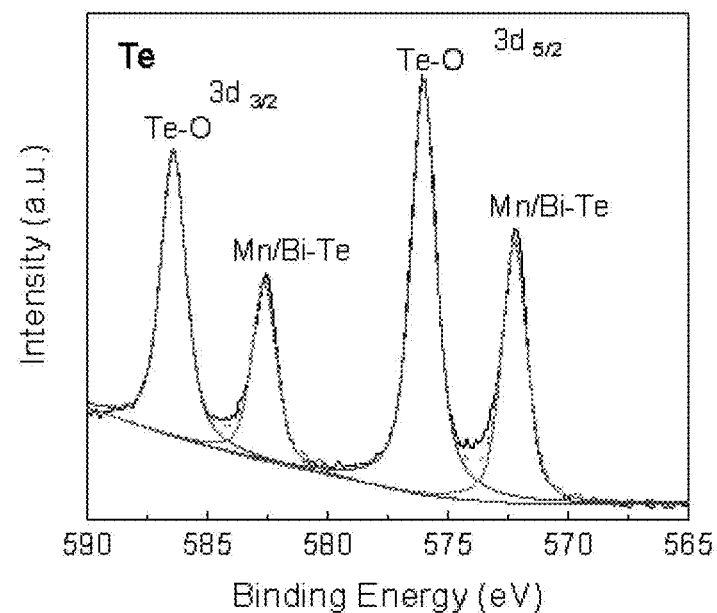
FIG. 13 shows a high resolution XPS spectrum of Te 3$d$ of the oxidized surface of the MnBi$_2$Te$_4$ single crystal made in embodiment 2.
Figure 14:
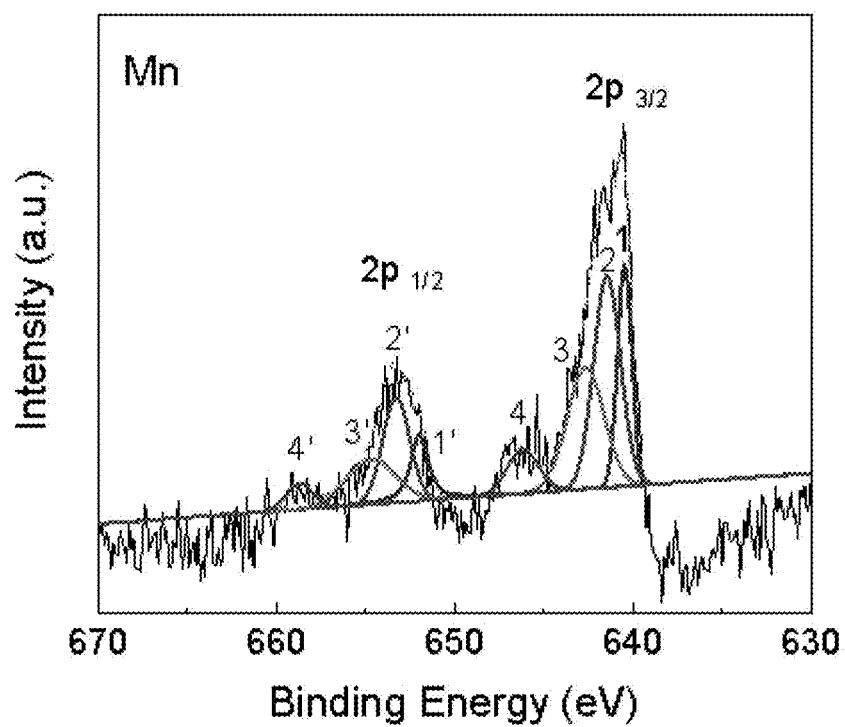
FIG. 14 shows a high resolution XPS spectrum of Mn 2$p$ of the oxidized surface of the MnBi$_2$Te$_4$ single crystal made in embodiment 2.

FIG. 11 shows a survey XPS spectrum of an oxidized surface of the $MnBi_2Te_4$ single crystal made in embodiment 2. FIG. 12 shows a high resolution XPS spectrum of Bi 4$f$ of the oxidized surface of the $MnBi_2Te_4$ single crystal made in embodiment 2. FIG. 13 shows a high resolution XPS spectrum of Te 3$d$ of the oxidized surface of the $MnBi_2Te_4$ single crystal made in embodiment 2. FIG. 14 shows a high resolution XPS spectrum of Mn 2$p$ of the oxidized surface of the $MnBi_2Te_4$ single crystal made in embodiment 2.

From FIGS. 7-14, it can be seen that the surface of the $MnBi_2Te_4$ single crystal includes four elements Mn, Bi, Te and O (element C is caused by the absorption of the $MnBi_2Te_4$ single crystal). The element O is caused by the oxidation of the $MnBi_2Te_4$ single crystal. As shown in FIGS. 7-10, the surface of the fresh $MnBi_2Te_4$ single crystal is slightly oxidized during the measurement. As shown in FIGS. 11-14, the surface of the $MnBi_2Te_4$ single crystal is obviously oxidized after being exposed to air for a long time.

Figure 15:
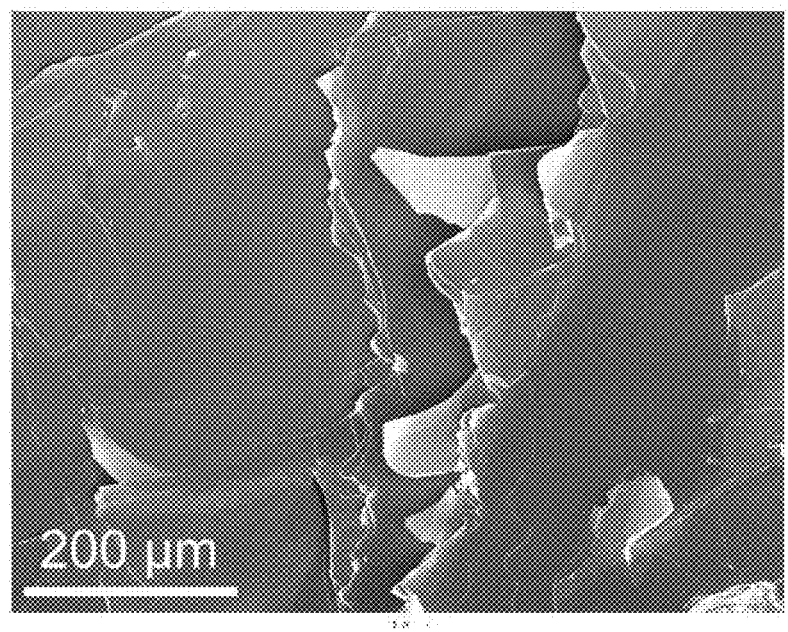
FIG. 15 shows a scanning electron microscope (SEM) image of the oxidized surface of the MnBi$_2$Te$_4$ single crystal made in embodiment 2.
Figure 16:
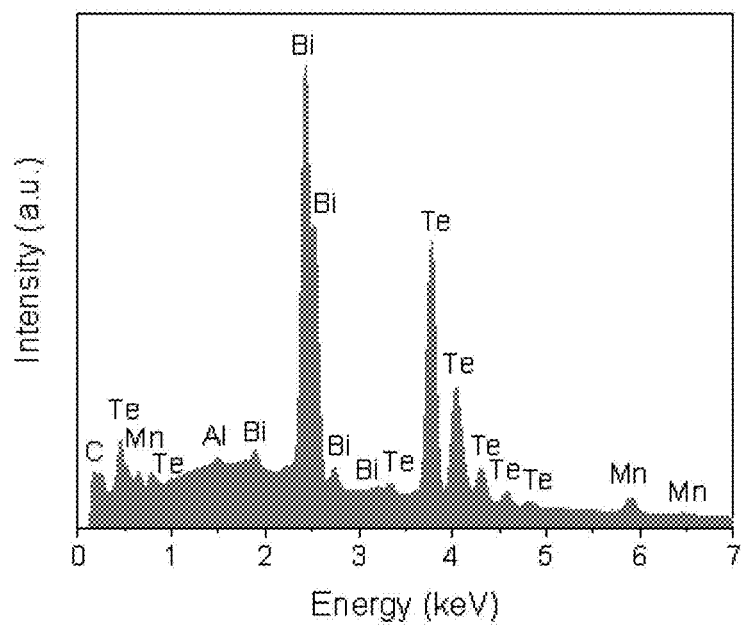
FIG. 16 shows an energy dispersive X-Ray spectrum (EDX) of the oxidized surface of the MnBi$_2$Te$_4$ single crystal made in embodiment 2.
Figure 17:
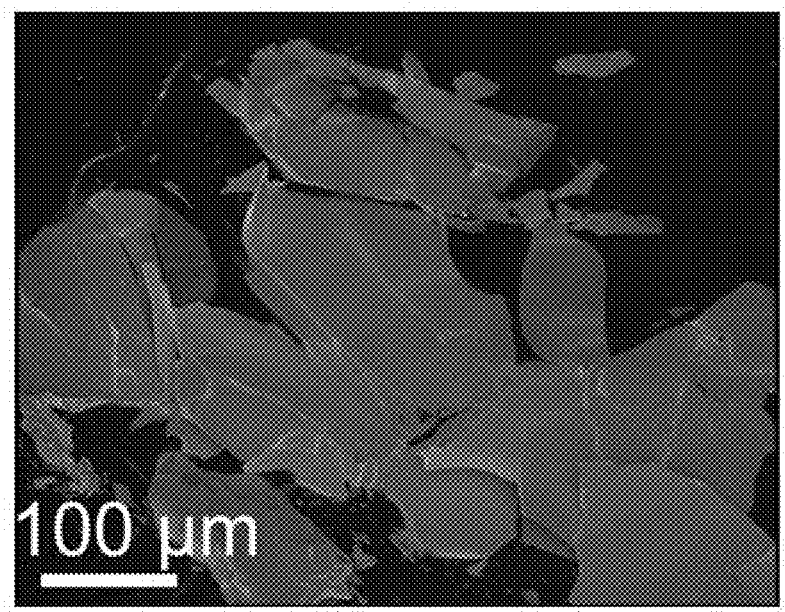
FIG. 17 shows an SEM image of the fresh surface of the MnBi$_2$Te$_4$ single crystal made in embodiment 2.
Figure 18:
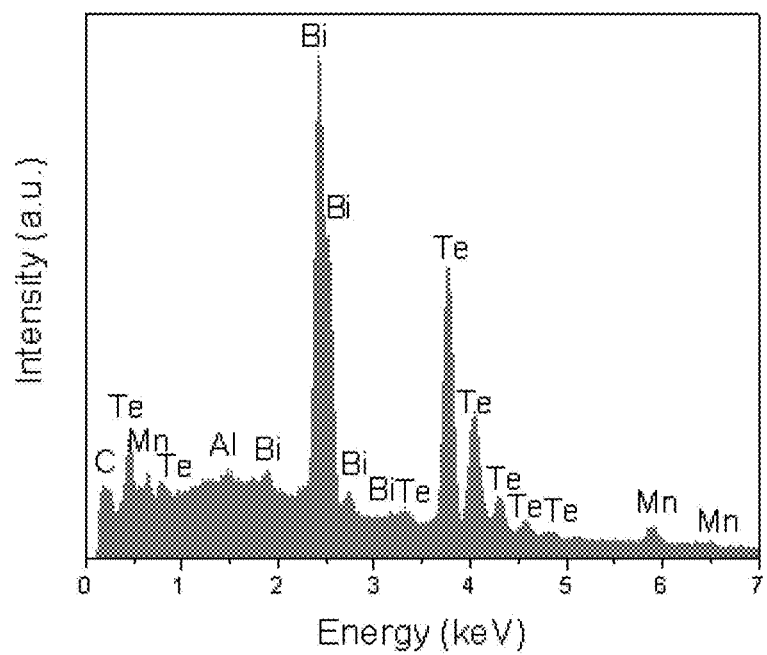
FIG. 18 shows an EDX spectrum of the fresh surface of the MnBi$_2$Te$_4$ single crystal made in embodiment 2.
Figure 19:
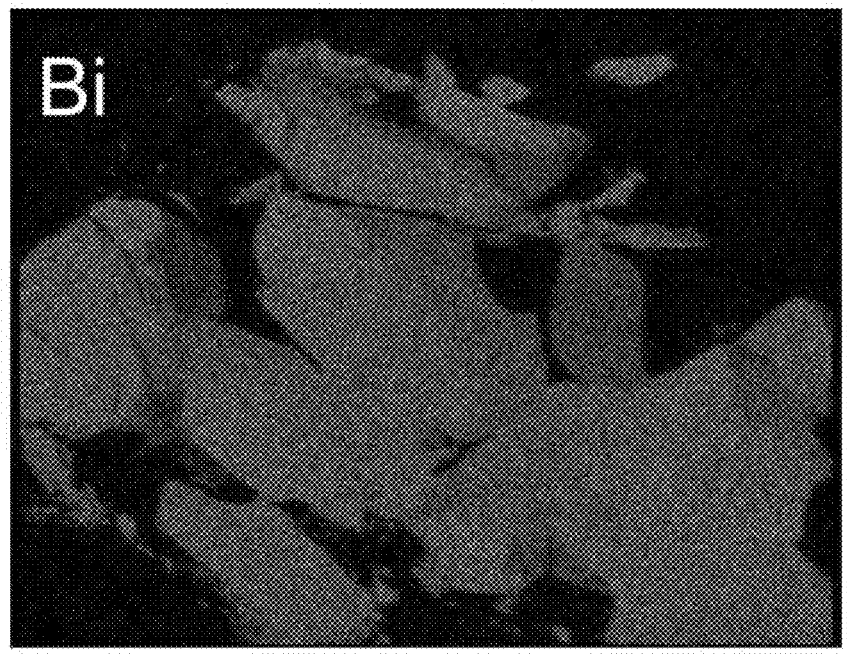
FIG. 19 shows Bi elemental EDX mapping of the fresh surface of the MnBi$_2$Te$_4$ single crystal made in embodiment 2.
Figure 20:
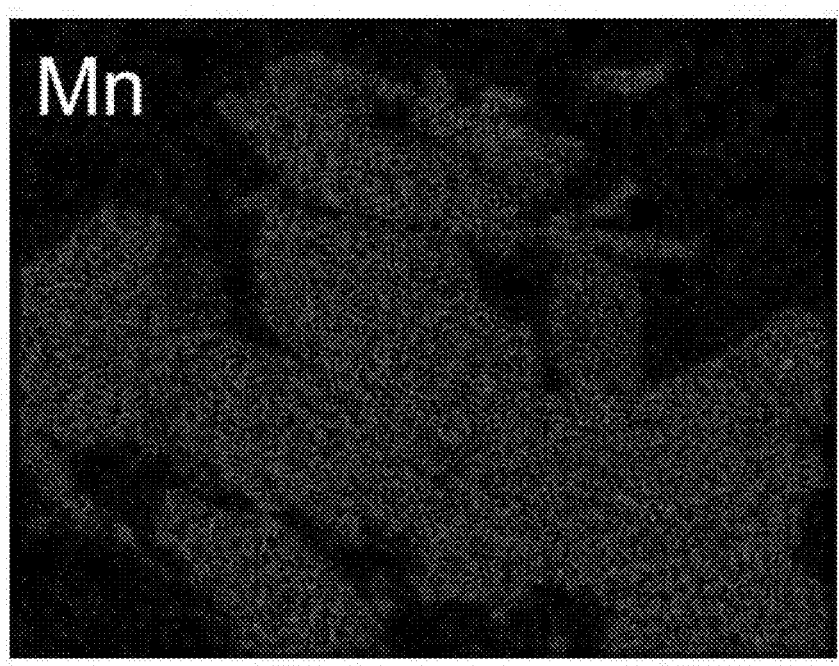
FIG. 20 shows a Mn elemental EDX mapping of the fresh surface of the MnBi$_2$Te$_4$ single crystal made in embodiment 2.
Figure 21:
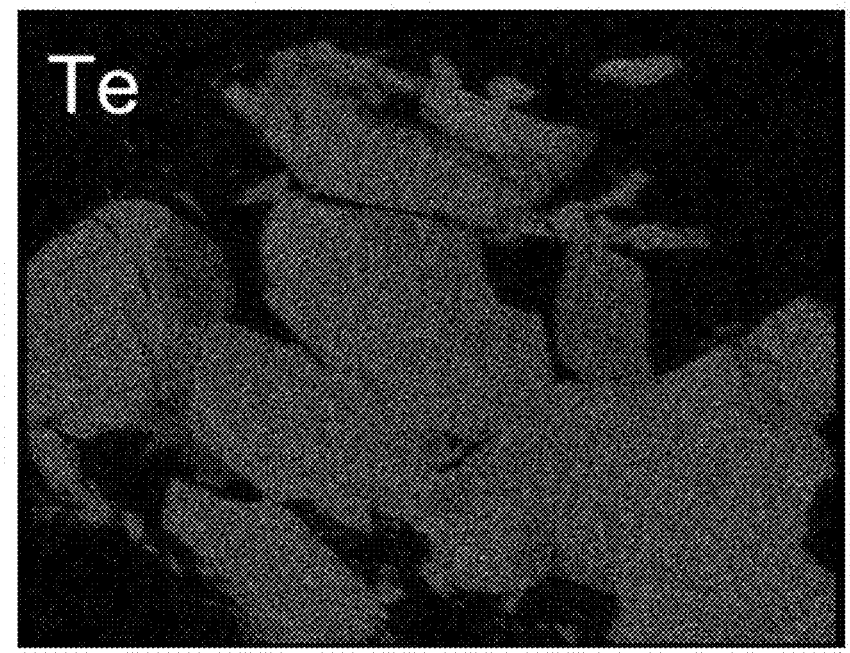
FIG. 21 shows a Te elemental EDX mapping of the fresh surface of the MnBi$_2$Te$_4$ single crystal made in embodiment 2.

FIG. 15 shows an SEM image of the oxidized surface of the $MnBi_2Te_4$ single crystal made in embodiment 2. FIG. 16 shows an EDX spectrum of the oxidized surface of the $MnBi_2Te_4$ single crystal made in embodiment 2. FIG. 17 shows a SEM image of the fresh surface of the $MnBi_2Te_4$ single crystal made in embodiment 2. FIG. 18 shows an EDX spectrum of the fresh surface of the $MnBi_2Te_4$ single crystal made in embodiment 2. FIG. 19 shows Bi elemental EDX mapping of the fresh surface of the $MnBi_2Te_4$ single crystal made in embodiment 2. FIG. 20 shows a Mn elemental EDX mapping of the fresh surface of the $MnBi_2Te_4$ single crystal made in embodiment 2. FIG. 21 shows a Te elemental EDX mapping of the fresh surface of the $MnBi_2Te_4$ single crystal made in embodiment 2.

From FIG. 15, it can be seen that the $MnBi_2Te_4$ single crystal has a flat surface. From FIG. 17, it can be seen that it is easy to peel off the $MnBi_2Te_4$ single crystal. From FIGS. 16 and 18, it can be seen that the $MnBi_2Te_4$ single crystal only includes three elements Mn, Bi and Te. From FIGS. 19-21, it can be seen that Mn, Bi and Te are dispersed uniformly. All of FIGS. 15-21 indicate that the $MnBi_2Te_4$ single crystal has high quality and purity.

Figure 22:
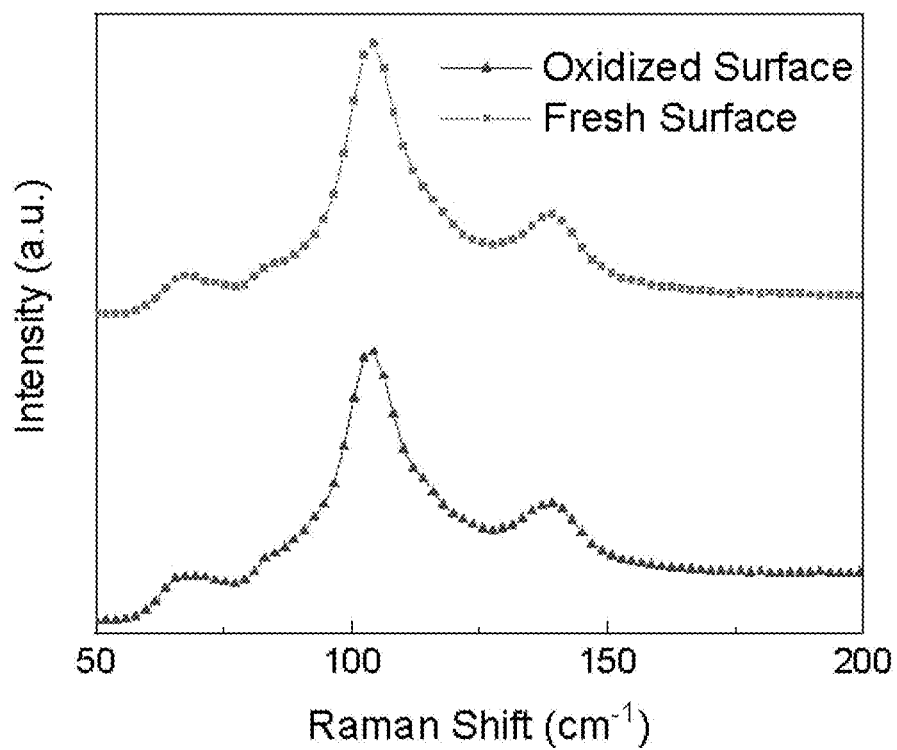
FIG. 22 shows a Raman spectra of the fresh surface and oxidized surface of the MnBi$_2$Te$_4$ single crystal made in embodiment 2.
Figure 23:
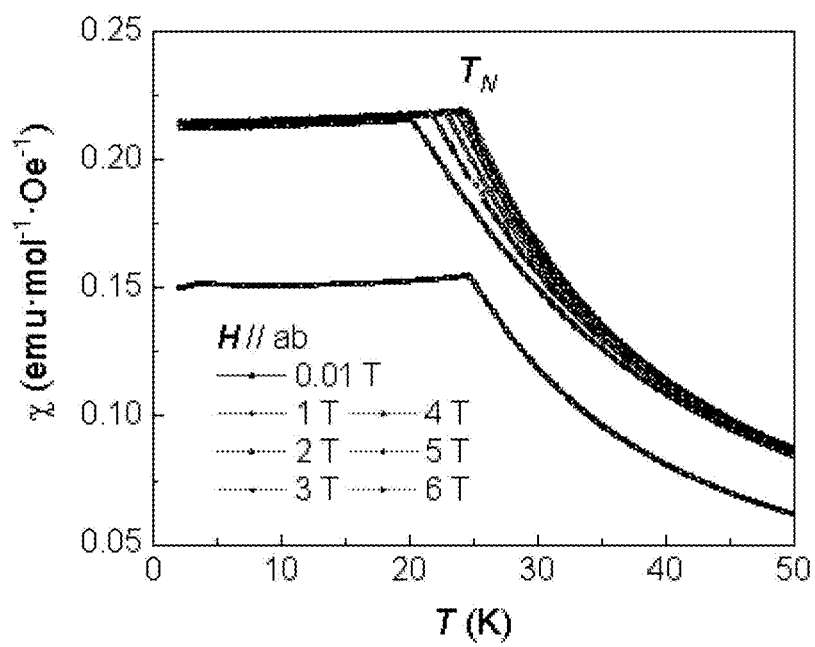
FIG. 23 shows temperature dependence of magnetization for the MnBi$_2$Te$_4$ single crystal made in embodiment 2, under different in-plane magnetic fields.
Figure 24:
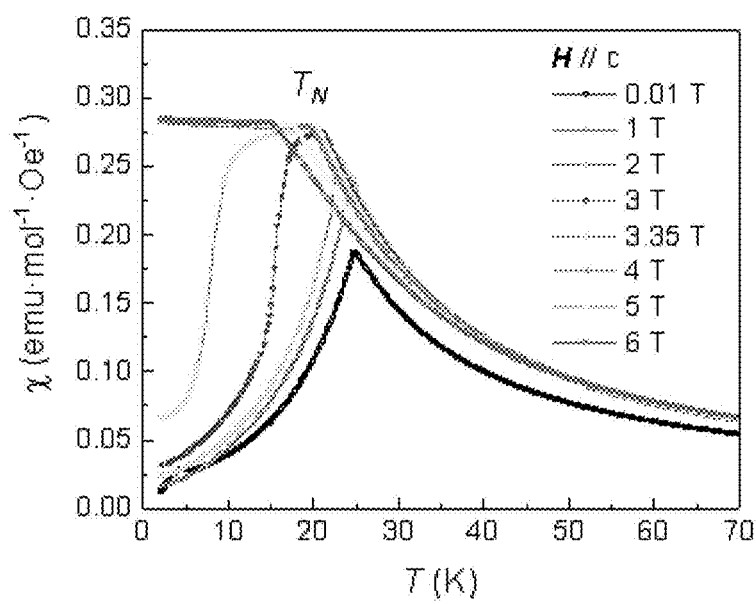
FIG. 24 shows temperature dependence of magnetization for the MnBi$_2$Te$_4$ single crystal made in embodiment 2, under different out-of-plane magnetic fields.
Figure 25:
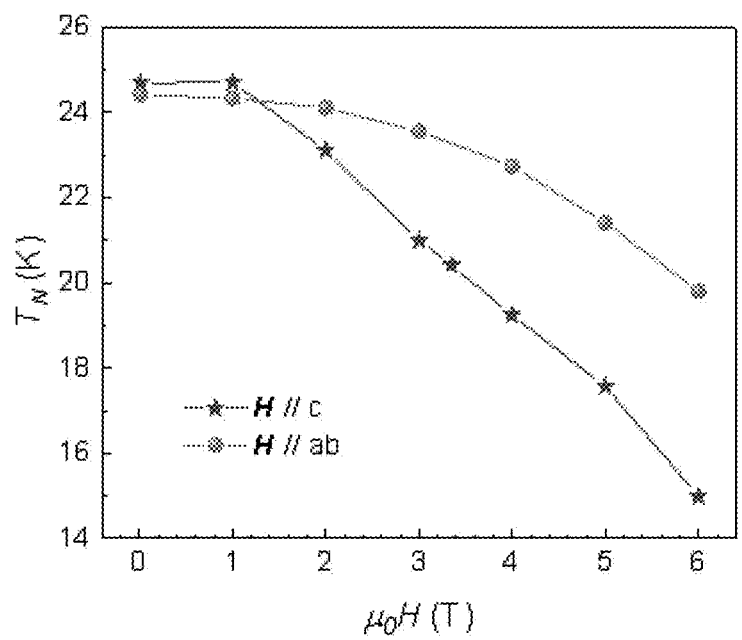
FIG. 25 shows Suppression of T$_N$ with increasing magnetic fields for the MnBi$_2$Te$_4$ single crystal made in embodiment 2, under different in-plane and out-of-plane magnetic fields.
Figure 26:
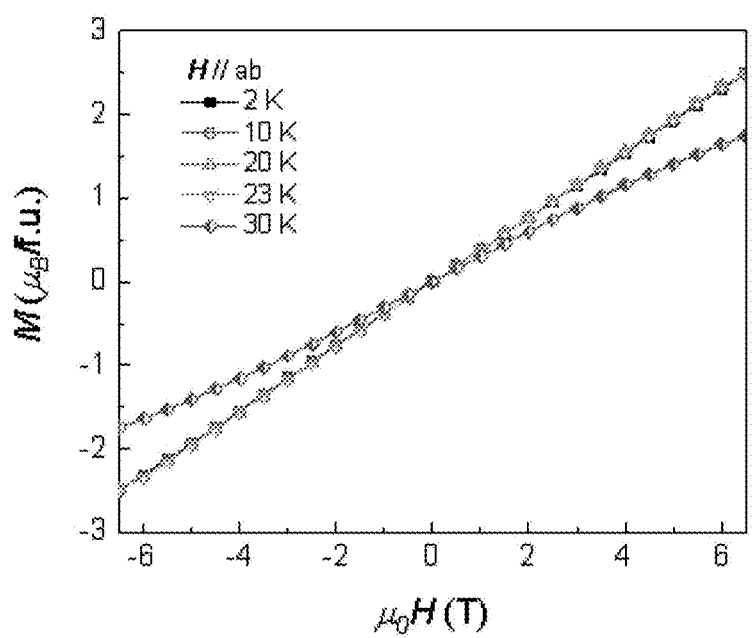
FIG. 26 shows field dependence of magnetization for the MnBi$_2$Te$_4$ single crystal made in embodiment 2 measured at different temperatures, under in-plane magnetic fields.
Figure 27:
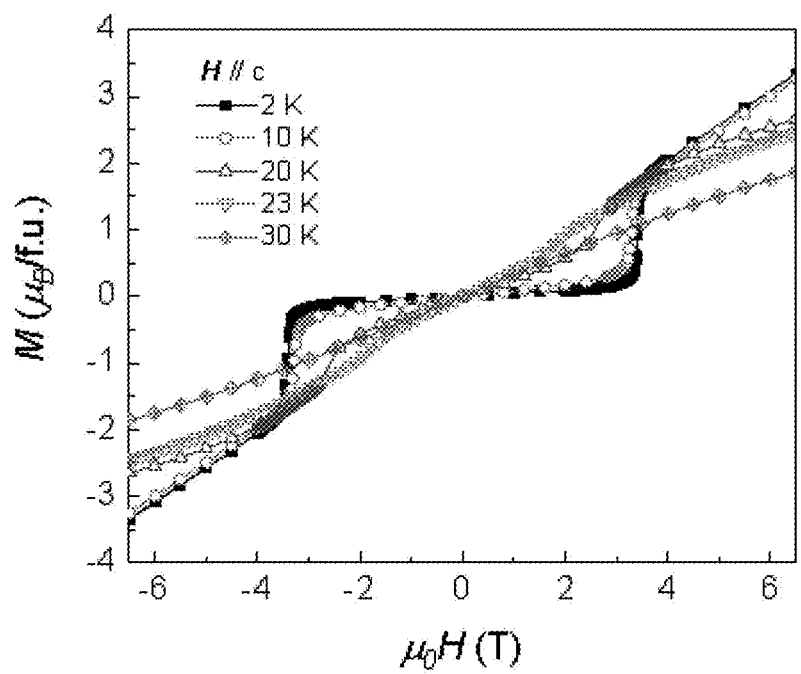
FIG. 27 shows field dependence of magnetization for the MnBi$_2$Te$_4$ single crystal made in embodiment 2 measured at different temperatures, under out-of-plane magnetic fields.

FIG. 22 shows Raman spectra of the fresh surface and oxidized surface of the $MnBi_2Te_4$ single crystal made in embodiment 2. FIG. 23 shows a relationship between magnetization intensity and temperature of the $MnBi_2Te_4$ single crystal made in embodiment 2, under different in-plane magnetic fields for the $MnBi_2Te_4$ single crystal. FIG. 24 shows a relationship between magnetization intensity and temperature of the $MnBi_2Te_4$ single crystal made in embodiment 2, under different out-of-plane magnetic fields for the $MnBi_2Te_4$ single crystal. FIG. 25 shows a relationship between Neel temperature and magnetic field intensity of the $MnBi_2Te_4$ single crystal made in embodiment 2, when the magnetic field direction is parallel to or not parallel to the plane of the $MnBi_2Te_4$ single crystal. FIG. 26 shows a relationship between magnetization intensity and magnetic field intensity of the $MnBi_2Te_4$ single crystal made in embodiment 2, under different temperatures when the magnetic field direction is parallel to the plane of the $MnBi_2Te_4$ single crystal. FIG. 27 shows a relationship between magnetization intensity and magnetic field intensity of the $MnBi_2Te_4$ single crystal made in embodiment 2, under different temperatures when the magnetic field direction is not parallel to the plane of the $MnBi_2Te_4$ single crystal.

From FIGS. 23-24, it can be seen that the $MnBi_2Te_4$ single crystal has an antiferromagnetic property. From FIG. 25, it can be seen that the $MnBi_2Te_4$ single crystal can have spin reversal at about 3.5 T when the magnetic field direction is not parallel to the plane of the $MnBi_2Te_4$ single crystal, that is also proved in FIGS. 26-27. From FIGS. 26-27, it can also be seen that the $MnBi_2Te_4$ single crystal has almost no hysteresis, that fits well with the theoretical predictive A-type antiferromagnetism (AFM) of the $MnBi_2Te_4$ single crystal.

Figure 28:
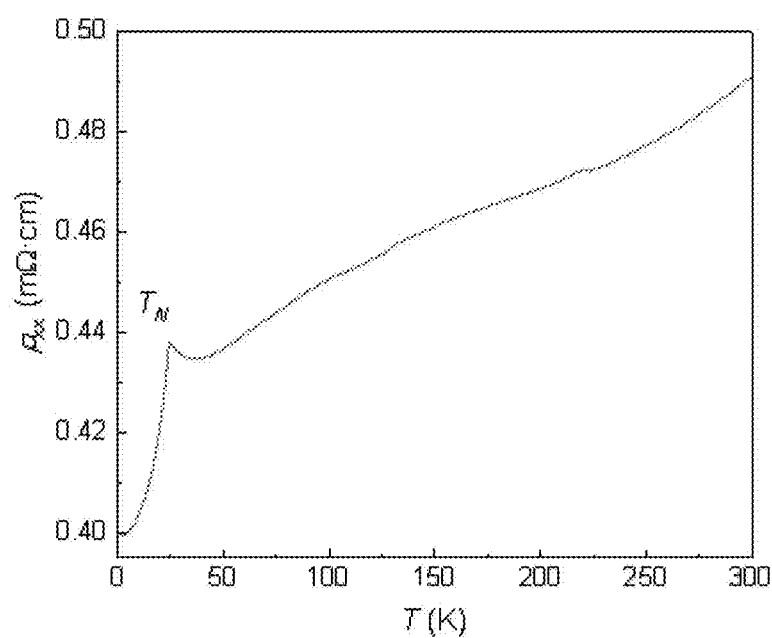
FIG. 28 shows a temperature dependence of longitudinal resistivity $\rho_{xx}$ measured from 1.6 K to room temperature for the MnBi$_2$Te$_4$ single crystal made in embodiment 2.
Figure 29:
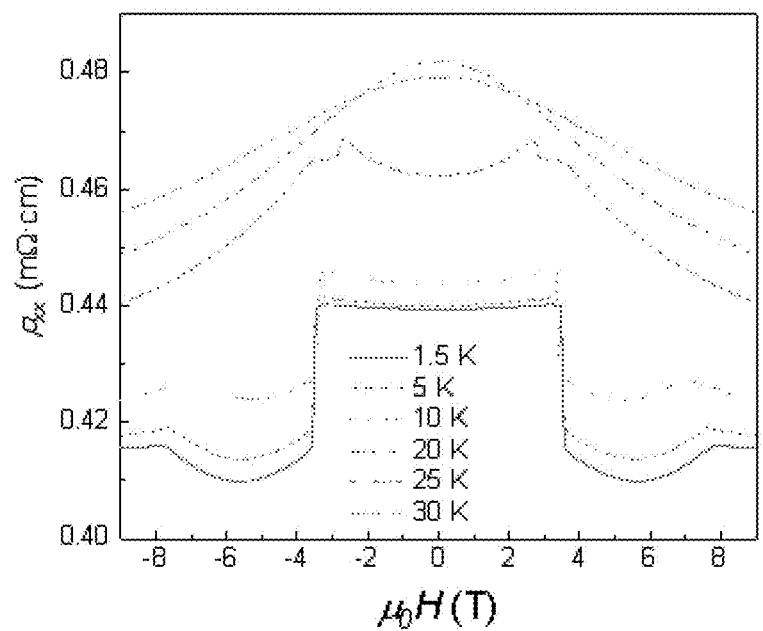
FIG. 29 shows magnetic field dependence of longitudinal resistivity at different temperatures for the MnBi$_2$Te$_4$ single crystal made in embodiment 2.
Figure 30:
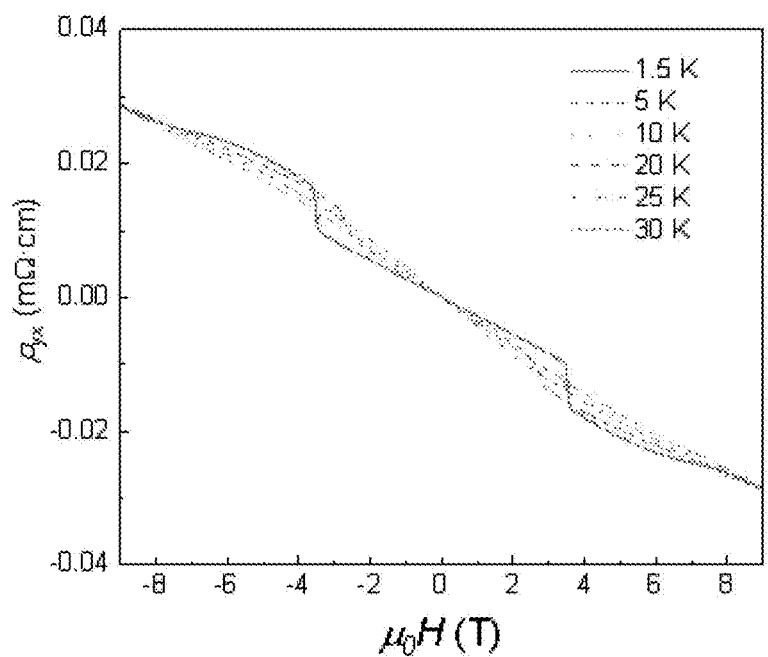
FIG. 30 shows magnetic field dependence of Hall resistivity at different temperatures for the MnBi$_2$Te$_4$ single crystal made in embodiment 2.
Figure 31:
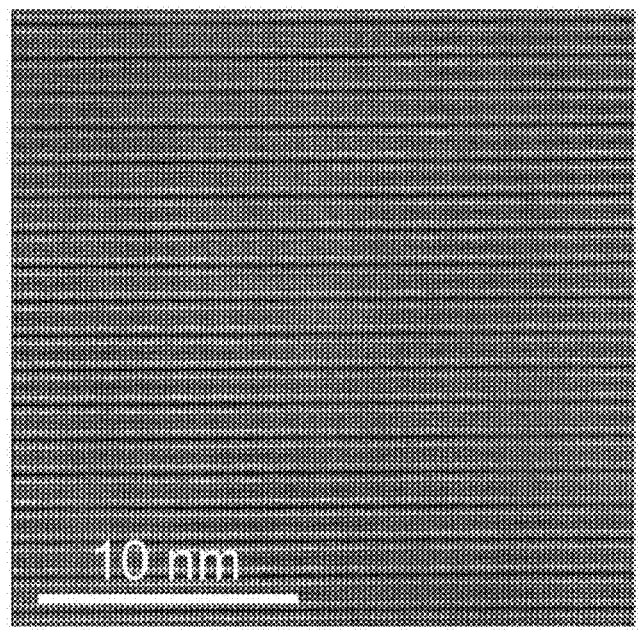
FIG. 31 shows a high-resolution high-angle annular dark field scanning transmission electron microscopy (HAADF-STEM) image for cross section corresponding to the (0 1 0) crystallographic plane of the MnBi$_2$Te$_4$ single crystal made in embodiment 2.

FIG. 28 shows a relationship between longitudinal resistivity and temperature of the $MnBi_2Te_4$ single crystal made in embodiment 2. FIG. 29 shows a relationship between longitudinal resistivity and magnetic induction of the $MnBi_2Te_4$ single crystal made in embodiment 2. FIG. 30 shows a relationship between Hall resistivity and magnetic induction of the $MnBi_2Te_4$ single crystal made in embodiment 2. From FIGS. 28 and 30, it can also be seen the antiferromagnetic property and spin reversal property at about 3.35 T of the $MnBi_2Te_4$ single crystal. FIG. 31 shows a cross-sectional spherical aberration-corrected high resolution transmission electron microscope (TEM) photo of the $MnBi_2Te_4$ single crystal made in embodiment 2. From FIG. 31, it can be seen that the $MnBi_2Te_4$ single crystal has high quality and has almost no defects.

Embodiment 3

The polycrystalline MnTe and the polycrystalline $Bi_2Te_3$ are mixed in Molar ratio of 1:1 to form a mixture. The mixture is first heated to 700° C. in a vacuum silica tube, then cooled to 591° C. slowly with a speed of 0.6° C./hour, and then annealed at 591° C. for 30 days to obtain an intermediate product. The intermediate product is directly air hardened from 591° C. to room temperature to obtain reaction product. The polycrystalline MnTe powder and the polycrystalline $Bi_2Te_3$ powder are removed from the reaction product, and the $MnBi_2Te_4$ single crystal is obtained.

Figure 6:
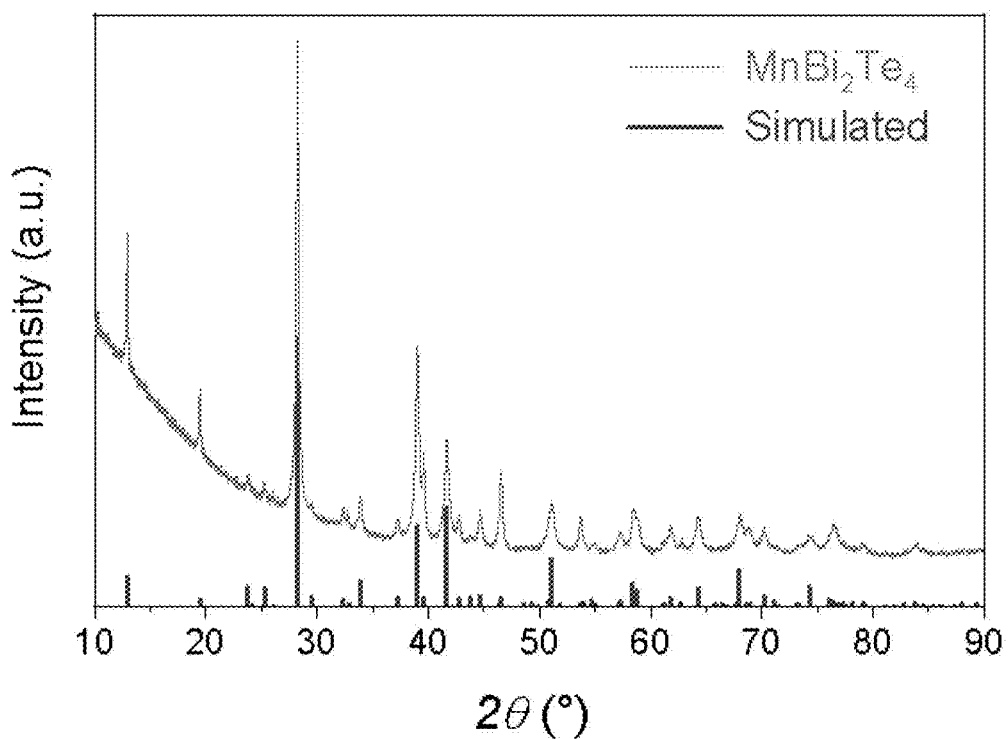
FIG. 6 shows an XRD pattern of the MnBi$_2$Te$_4$ single crystal made in embodiment 3.

The method of embodiment 3 is similar with the method of embodiment 1, except that the annealing time is 30 days. The product of embodiment 3 has obviously less polycrystalline MnTe powder and the polycrystalline $Bi_2Te_3$ powder than the product of embodiment 1. FIG. 6 shows an XRD result of the MnBi$_2$Te$_4$ single crystal made in embodiment 3 after being ground to powder. It can be seen that the XRD peak of FIG. 6 is narrower than the XRD peak of FIG. 5. Thus, the quality of the MnBi$_2$Te$_4$ single crystal is improved by extending annealing time.

Embodiment 4

The polycrystalline MnTe and the polycrystalline Bi$_2$Te$_3$ are mixed in Molar ratio of 1:1 to form a mixture. The mixture is first heated to 800° C. in a vacuum silica tube, then cooled to 591° C. slowly with a speed of 0.6° C./hour, and then annealed at 591° C. for 10 days to obtain an intermediate product. The intermediate product is directly air hardened from 591° C. to room temperature to obtain reaction product. The polycrystalline MnTe powder and the polycrystalline Bi$_2$Te$_3$ powder are removed from the reaction product, and the MnBi$_2$Te$_4$ single crystal is obtained. The method of embodiment 4 is similar with the method of embodiment 1, except that the mixture is first heated to 800° C. in a vacuum silica tube before cooling to 591° C.

Embodiment 5

The polycrystalline MnTe and the polycrystalline Bi$_2$Te$_3$ are mixed in Molar ratio of 1:1 to form a mixture. The mixture is first heated to 900° C. in a vacuum silica tube, then cooled to 591° C. slowly with a speed of 0.6° C./hour, and then annealed at 591° C. for 10 days to obtain an intermediate product. The intermediate product is directly air hardened from 591° C. to room temperature to obtain reaction product. The polycrystalline MnTe powder and the polycrystalline Bi$_2$Te$_3$ powder are removed from the reaction product, and the MnBi$_2$Te$_4$ single crystal is obtained. The method of embodiment 5 is similar with the method of embodiment 1, except that the mixture is first heated to 900° C. in a vacuum silica tube before cooling to 591° C.

Embodiment 6

The polycrystalline MnTe and the polycrystalline Bi$_2$Te$_3$ are mixed in Molar ratio of 1:1 to form a mixture. The mixture is first heated to 700° C. in a vacuum silica tube, then cooled to 591° C. slowly with a speed of 0.9° C./hour, and then annealed at 591° C. for 10 days to obtain an intermediate product. The intermediate product is directly air hardened from 591° C. to room temperature to obtain reaction product. The polycrystalline MnTe powder and the polycrystalline Bi$_2$Te$_3$ powder are removed from the reaction product, and the MnBi$_2$Te$_4$ single crystal is obtained. The method of embodiment 6 is similar with the method of embodiment 1, except that the cooling speed is 0.9° C./hour.

Embodiment 7

The polycrystalline MnTe and the polycrystalline Bi$_2$Te$_3$ are mixed in Molar ratio of 1:1 to form a mixture. The mixture is first heated to 700° C. in a vacuum silica tube, then cooled to 591° C. slowly with a speed of 1° C./hour, and then annealed at 591° C. for 10 days to obtain an intermediate product. The intermediate product is directly air hardened from 591° C. to room temperature to obtain reaction product. The polycrystalline MnTe powder and the polycrystalline Bi$_2$Te$_3$ powder are removed from the reaction product, and the MnBi$_2$Te$_4$ single crystal is obtained. The method of embodiment 7 is similar with the method of embodiment 1, except that the cooling speed is 1° C./hour.

Embodiment 8

The polycrystalline MnTe and the polycrystalline Bi$_2$Te$_3$ are mixed in Molar ratio of 1:1 to form a mixture. The mixture is first heated to 700° C. in a vacuum silica tube, then cooled to 600° C. slowly with a speed of 0.6° C./hour, and then annealed at 600° C. for 10 days to obtain an intermediate product. The intermediate product is directly air hardened from 600° C. to room temperature to obtain reaction product. The polycrystalline MnTe powder and the polycrystalline Bi$_2$Te$_3$ powder are removed from the reaction product, and the MnBi$_2$Te$_4$ single crystal is obtained. The method of embodiment 8 is similar with the method of embodiment 1, except that the annealing temperature is 600° C.

Embodiment 9

The polycrystalline MnTe and the polycrystalline Bi$_2$Te$_3$ are mixed in Molar ratio of 1:1 to form a mixture. The mixture is first heated to 700° C. in a vacuum silica tube, then cooled to 570° C. slowly with a speed of 0.6° C./hour, and then annealed at 570° C. for 10 days to obtain an intermediate product. The intermediate product is directly air hardened from 570° C. to room temperature to obtain reaction product. The polycrystalline MnTe powder and the polycrystalline Bi$_2$Te$_3$ powder are removed from the reaction product, and the MnBi$_2$Te$_4$ single crystal is obtained. The method of embodiment 9 is similar with the method of embodiment 1, except that the annealing temperature is 570° C.

Embodiment 10

The elemental Mn, Bi and Te (purity higher than 99.99%) are mixed in Molar ratio of 1:2:4 to obtain a Mn/Bi/Te mixture. The Mn/Bi/Te mixture is sintered in a vacuum silica tube at 700° C. for about 3 days to obtain the mixture of polycrystalline MnTe and polycrystalline Bi$_2$Te$_3$. The vacuum silica tube is then cooled to 591° C. slowly with a speed of 0.6° C./hour, and then kept at 591° C. for 14 days to obtain an intermediate product. The intermediate product is directly air hardened from 591° C. to room temperature to obtain reaction product. The polycrystalline MnTe powder and the polycrystalline Bi$_2$Te$_3$ powder are removed from the reaction product, and the MnBi$_2$Te$_4$ single crystal is obtained. The method of embodiment 10 is similar with the method of embodiment 1, except that the mixture of polycrystalline MnTe and polycrystalline Bi$_2$Te$_3$ is made directly from the elemental Mn, Bi and Te.

Comparative Embodiment I

Figure 32:
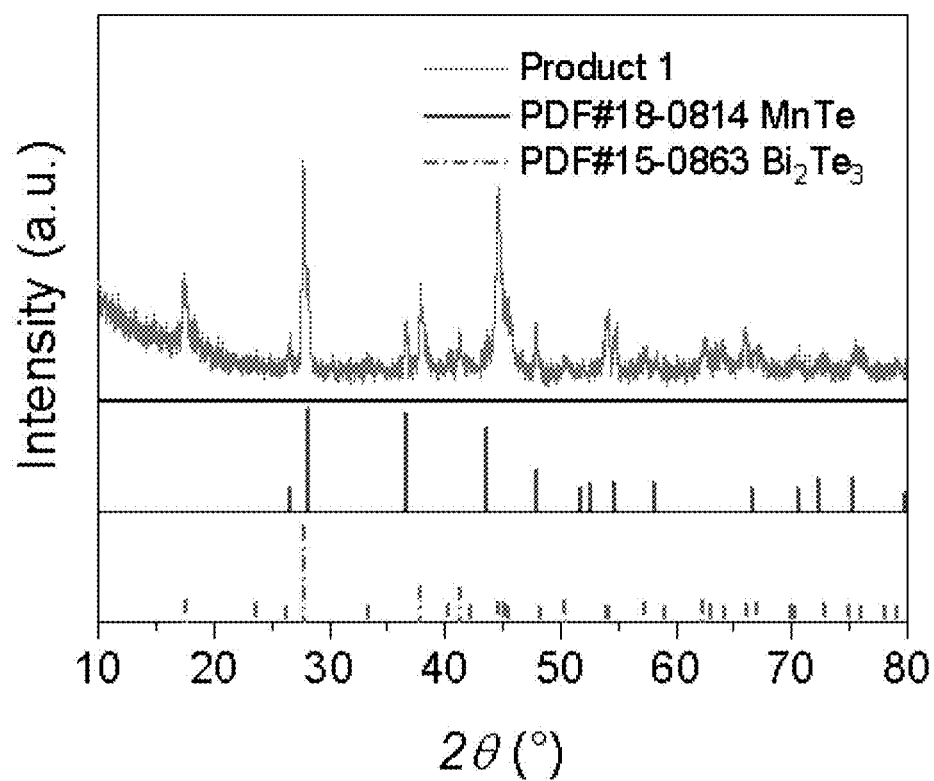
FIG. 32 shows an XRD pattern of the product 1 made in comparative embodiment I.

The elemental Mn, Bi and Te (purity higher than 99.99%) are mixed in Molar ratio of 1:2:4 to obtain a Mn/Bi/Te mixture. The Mn/Bi/Te mixture is sintered in a vacuum silica tube at 700° C. for about 3 days to obtain an intermediate product. The intermediate product is directly air hardened from 700° C. to room temperature to obtain product 1. The method of comparative embodiment I is similar with the method of embodiment 10, except that the annealing is omitted and the Mn/Bi/Te mixture is air hardened directly from 700° C. FIG. 32 shows an XRD result of the product 1 made in comparative embodiment I. From FIG. 32, it can be seen that the product 1 made in comparative embodiment I is a mixture of polycrystalline MnTe and polycrystalline $Bi_2Te_3$. Thus, without annealing, $MnBi_2Te_4$ single crystal cannot be obtained.

Comparative Embodiment II

The polycrystalline MnTe and the polycrystalline $Bi_2Te_3$ are mixed in Molar ratio of 1:1 to form a mixture. The mixture is first heated to 700° C. in a vacuum silica tube, then cooled to 591° C. slowly with a speed of 0.6° C./hour, and then annealed at 591° C. for 3 days to obtain an intermediate product. The intermediate product is directly air hardened from 591° C. to room temperature to obtain product 2.

Figure 33:
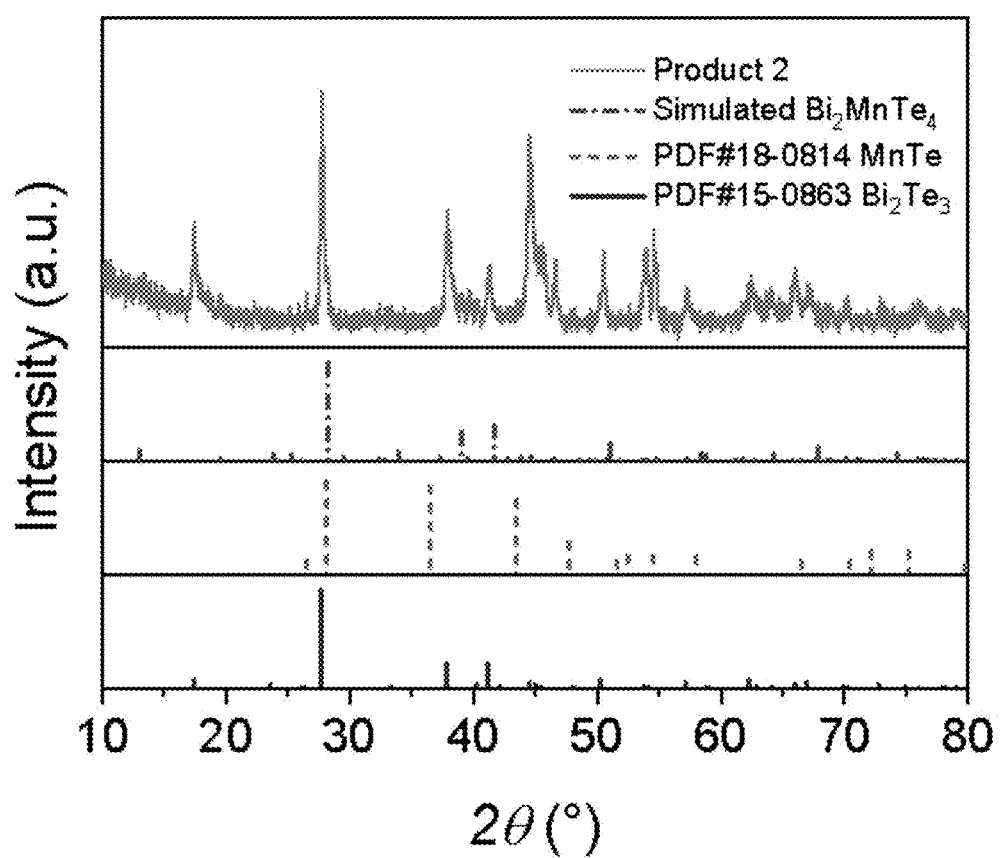
FIG. 33 shows an XRD pattern of the product 2 made in comparative embodiment II.

The method of comparative embodiment II is similar with the method of embodiment 1, except that the annealing time is 3 days. FIG. 33 shows an XRD result of the product 2 made in comparative embodiment II. From FIG. 33, it can be seen that the product 2 made in comparative embodiment II is a mixture of polycrystalline MnTe, polycrystalline $Bi_2Te_3$, and of polycrystalline $MnBi_2Te_4$ powder. It is hard to separate the polycrystalline $MnBi_2Te_4$ powder from the polycrystalline MnTe and polycrystalline $Bi_2Te_3$. The $MnBi_2Te_4$ single crystal cannot be obtained by annealing only for 3 days.

It is to be understood that the above-described embodiments are intended to illustrate rather than limit the disclosure. Any elements described in accordance with any embodiments is understood that they can be used in addition or substituted in other embodiments. Embodiments can also be used together. Variations may be made to the embodiments without departing from the spirit of the disclosure. The above-described embodiments illustrate the scope of the disclosure but do not restrict the scope of the disclosure.

Depending on the embodiment, certain of the actions of methods described may be removed, others may be added, and the sequence of actions may be altered. It is also to be understood that the description and the claims drawn to a method may include some indication in reference to certain actions. However, the indication used is only to be viewed for identification purposes and not as a suggestion as to an order for the actions.

What is claimed is:

1. A method for making $MnBi_2Te_4$ single crystal, the method comprising:
   providing a mixture of polycrystalline MnTe and polycrystalline $Bi_2Te_3$ in Molar ratio of 1.1:1~1:1.1;
   heating the mixture in a vacuum reaction chamber to 700° C.~900° C., cooling the mixture to 570° C.~600° C. at a speed less than or equal to 1° C./hour, and annealing the mixture at 570° C.~600° C. for at least 10 days to obtain an intermediate product; and
   air quenching the intermediate product from 570° C.~600° C. to room temperature.

2. The method of claim 1, wherein the providing the mixture of polycrystalline MnTe and polycrystalline $Bi_2Te_3$ comprises: making the polycrystalline MnTe and polycrystalline $Bi_2Te_3$ first respectively; and mixing the polycrystalline MnTe and polycrystalline $Bi_2Te_3$.

3. The method of claim 2, wherein the polycrystalline MnTe is made by following steps: mixing elemental Mn and Te in Molar ratio of 1:1 to obtain a Mn/Te mixture; sintering the Mn/Te mixture in a vacuum room at 700° C.~1000° C. for approximately 3~5 days to obtain a reaction product; and natural cooling the reaction product.

4. The method of claim 2, wherein the polycrystalline $Bi_2Te_3$ is made by following steps: mixing elemental Bi and Te in Molar ratio of 2:3 to obtain a Bi/Te mixture; sintering the Bi/Te mixture in a vacuum room at 700° C.~1000° C. for approximately 24~40 hours; cooling the vacuum room to 560° C.~580° C. by a speed of 0.1° C./minute to obtain a reaction product; and air quenching the reaction product from 560° C.~580° C. to room temperature.

5. The method of claim 1, wherein the Molar ratio of the polycrystalline MnTe and the polycrystalline $Bi_2Te_3$ is 1:1.

6. The method of claim 1, wherein the mixture is cooled to 570° C.~600° C. at the speed less than or equal to 0.6° C./hour.

7. The method of claim 1, wherein the mixture is annealed at 591° C.

8. The method of claim 1, wherein the mixture is annealed for at least 14 days.

9. The method of claim 1, wherein a pressure of the vacuum reaction chamber is less than 10 Pa.

10. The method of claim 1, wherein the intermediate product is removed from the reaction chamber directly and cooled in air in the process of air quenching.

11. A method for making $MnBi_2Te_4$ single crystal, the method comprising:
    mixing elemental Mn, Bi and Te in Molar ratio of 1:2:4 to obtain a Mn/Bi/Te mixture;
    sintering the Mn/Bi/Te mixture in a vacuum reaction chamber at 700° C.~900° C. for approximately 3~5 days to obtain a mixture of polycrystalline MnTe and polycrystalline $Bi_2Te_3$;
    cooling the mixture to 570° C.~600° C. at a speed less than or equal to 1° C./hour;
    annealing the mixture at 570° C.~600° C. for at least 10 days to obtain an intermediate product; and
    air quenching the intermediate product from 570° C.~600° C. to room temperature.

12. The method of claim 11, wherein the mixture is cooled to 570° C.~600° C. at the speed less than or equal to 0.6° C./hour.

13. The method of claim 11, wherein the mixture is annealed at 591° C.

14. The method of claim 11, wherein the mixture is annealed for at least 14 days.

15. The method of claim 11, wherein a pressure of the vacuum reaction chamber is less than 10 Pa.

16. The method of claim 11, wherein the intermediate product is removed from the reaction chamber directly and cooled in air in the process of air quenching.

* * * * *